United States Patent [19]

Liang et al.

[11] Patent Number: 5,781,233
[45] Date of Patent: Jul. 14, 1998

[54] MOS FET CAMERA CHIP AND METHODS OF MANUFACTURE AND OPERATION THEREOF

[75] Inventors: Jie Liang, Choa Chin Kang; Siang-Tze Wee, Singapore, both of Singapore

[73] Assignee: TriTech Microelectronics, Ltd., Singapore, Singapore

[21] Appl. No.: 615,460

[22] Filed: Mar. 14, 1996

[51] Int. Cl.$^6$ .............................. H04N 3/14; H04N 5/335
[52] U.S. Cl. .......................... 348/302; 348/229; 257/233
[58] Field of Search ................................. 348/229, 230, 348/300, 301, 302, 308, 304; 257/233, 215

[56] References Cited

U.S. PATENT DOCUMENTS

| | | | |
|---|---|---|---|
| 4,680,476 | 7/1987 | Berger et al. | 250/578 |
| 5,016,108 | 5/1991 | Akimoto et al. | 358/212 |
| 5,019,702 | 5/1991 | Ohzu et al. | 250/208.1 |
| 5,019,820 | 5/1991 | Matsuzawa et al. | 341/156 |
| 5,043,820 | 8/1991 | Wyles et al. | 358/213.28 |
| 5,109,155 | 4/1992 | Mukainakano et al. | 250/208.1 |
| 5,153,420 | 10/1992 | Hack et al. | 250/208.1 |
| 5,165,075 | 11/1992 | Hiroki et al. | 359/59 |
| 5,345,266 | 9/1994 | Denyer | 348/300 |
| 5,382,977 | 1/1995 | Kozlowski et al. | 348/300 |
| 5,389,971 | 2/1995 | Ishida et al. | 348/294 |
| 5,401,952 | 3/1995 | Sugawa | 250/208.1 |

*Primary Examiner*—Andrew I. Faile
*Assistant Examiner*—Christopher Onuaku
*Attorney, Agent, or Firm*—George O. Saile; Stephen B. Ackerman; Graham S. Jones, II

[57] ABSTRACT

An integrated circuit functions as an image detector providing an output signal representing the detected image. A two dimensional array of sensor cells is formed in rows and columns. A digital timing control means has outputs for providing timing signals. An address encoder is coupled to receive timing control signals from the digital timing control means. Each sensor cell has a photodiode and a first transistor having a first gate and having a source/drain circuit for precharging the cell and a second transistor having a second gate and a source/drain circuit for reading from the photodiode. The sensor cells are adapted for sensing electromagnetic radiation incident thereon. A plurality of sensor data amplifiers receives data from the cells. Means is provided for reading data from the cells into the sensor data amplifiers, and the sense amplifiers include an output circuit.

22 Claims, 8 Drawing Sheets

MOS FET CAMERA CHIP AND METHODS OF MANUFACTURE AND OPERATION THEREOF

BACKGROUND OF THE INVENTION

1. Field of the Invention

This invention relates to semiconductor integrated circuits chips and more particularly to MOSFET camera chips and methods of manufacture thereof.

2. Description of Related Art

U.S. Pat. No. 5,345,266 of Denyer for "Matrix Array Image Sensor Chip" shows a matrix array image sensor integrated circuit chip with a an image integration cell comprising a photodiode having its anode grounded and its cathode connected to the source of a single NMOS transistor. The drain of the NMOS transistor is connected via a bit line to the drain of a remotely located PMOS transistor which has its source connected to a power supply voltage Vdd. The control electrode of the NMOS transistor is connected to a word line.

U.S. Pat. No. 5,016,108 of Akimoto et al for "Solid-State Imaging Device Having Series-Connected Pairs of Switching MOS Transistors for Transferring Signal Electric Charges Therethrough" shows an imaging device having pairs of MOS devices associated with a photodiode in a matrix of pixels. The pair of MOS transistors have their S/D circuits connected in series with the photodiode between signal line from the horizontal shift register and have their gate electrodes connected to the same gate line from a vertical shift register.

U.S. Pat. No. 5,043,820 of Wyles for "Focal Plane Array Readout Employing One Capacitive Feedback Transimpedance Amplifier for Each Column" shows a unit cell of with a detector input circuit connected to the node between a grounded capacitor and the S/D circuit of an MOS device which operates as a switch with its control gate connected to a horizontal signal line.

Additional references include

U.S. Pat. No. 5,389,971 of Ishida et al for "Image Sensor Provided on a Chip and Having Amplifying Means;"

U.S. Pat. No. 5,153,420 of Hack, 5,382,977 of Kozlowski;

U.S. Pat. No. 4,680,476 of Berger for "Photosensitive Row Transfer Device Provided with Negative Feedback Amplifiers";

U.S. Pat. No. 5,165,075 of Hiroki et al for "Electro-Optic Device Having Pairs of Complementary Transistors";

U.S. Pat. No. 5,109,155 of Mukainakano et al for "Semiconductor Image Sensor with an Integrated Voltage Regulator";

U.S. Pat. No. 5,019,820 of Matsuzawa for "Serial-Parallel Type A/D Converter Having Reference Resistor Chain and Current Source Array"; and U.S. Pat. No. 5,019,702 of Ohzu et al for "Photoelectric Transducer Apparatus Having a Plurality of Transducer Elements and a Plurality of Capacitor Elements".

Use has been made of two transistors in a photodiode array sensor array in the case of Akimoto et al. with the two source/drains circuits of transistors connected in series with their control gates connected together with a photodiode formed in a P well but location of the type of the MOS transistors not described.

SUMMARY OF THE INVENTION

An object of this invention is to provide an integrated circuit which functions as an image detector which employs two transistors in a photosensor pixel array with reduced parasitics.

Another object of this invention is to provide a photosensor pixel array with an integrated power amplifier on the chip.

A further object of this invention is to provide a photosensor pixel array which provides an output signal which is a measure of the strength of focus of the image.

Still another object of this invention is a photosensor pixel array comprising a part of an autofocus system.

One way of determining the strength of focus is by comparing the contrast (i.e., the difference in signal intensity) of the output from adjacent sense cells (or adjacent groups of sense cells). The larger the difference in signal intensity, the stronger the focus.

The strength of focus may be used in a camera chip system to determine that position of an external lens which provides maximal focus of the incident light (and image) to the chip sense-array surface. Hence, it may be used to allow the camera chip to autofocus, i.e., automatically self-adjust to provide a maximally focussed image.

Figure 8:
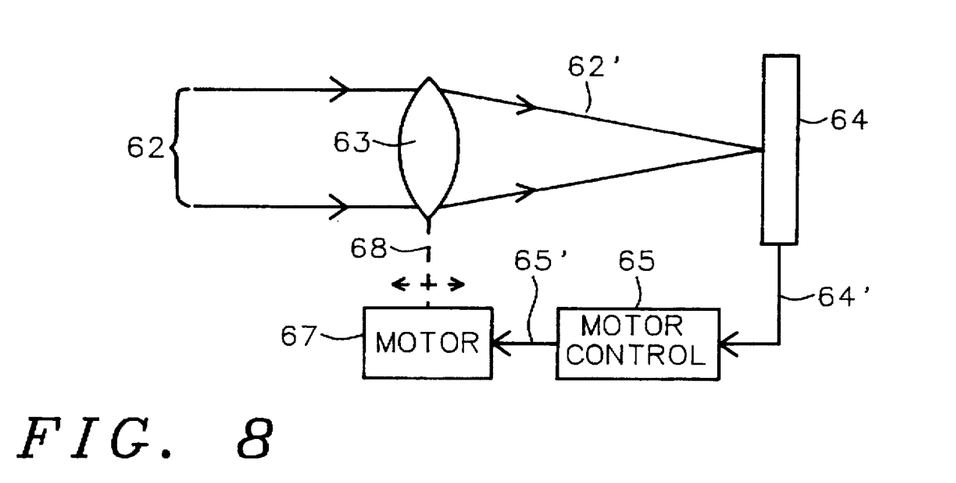
FIG. 8 shows an example of a camera autofocus mechanism is shown in the configuration in which a light beam is directed through a camera lens as a focussed beam directed towards the surface of a sense-array chip with a feedback system in which an electromechanical device to adjust the distance between the camera lens and the sense-array surface of the chip.

An example of a camera autofocus mechanism is shown in the configuration in FIG. 8 in which a light beam 62 is directed through a camera lens 63 as focussed beam 62' towards the surface of a sense-array chip 64. FIG. 8 illustrates a feedback system in which an electromechanical device (e.g., a miniature motor 67) is used to operate a conventional mechanical linkage 68 shown in phantom to adjust the distance between the camera lens 63 and the sense-array surface of the chip 64. The motor control block 65 receives a signal F (Focus) on line 64' from the camera chip 64. Control block 65 provides a signal on line 65' which controls the motor 67 energizes mechanical link 68 to adjust the distance along the direction of the dotted line arrows between the chip 64 and the lens 63. step-wise, in that direction which increases the value of F (Focus). As this process of focussing operates continually, the camera is kept in maximal focus continually.

An important feature of this invention is a fully integrated system with a power amplifier and display drive devices incorporated on an integrated circuit chip.

Another object of this invention is to provide an integrated circuit which functions as an image detector which provides an output signal representing the detected image with a two-dimensional array of groups of sensor cells, wherein each of the sensor cells has a photodiode and a pair of transistors for writing to and reading from the photodiode, the cell sensing incident electromagnetic radiation. Sense-amplifiers are associated with the cells.

In accordance with this invention an integrated circuit functions as an image detector which provides an output signal representing the detected image. A two dimensional array of sensor cells is formed in rows and columns. A digital timing control means has outputs for providing timing signals. An address encoder is coupled to receive timing control signals from the digital timing control means. Each sensor cell has a photodiode and a first transistor having a first gate and having a source/drain circuit for precharging the cell and a second transistor having a second gate and a source/drain circuit for reading from the photodiode. The sensor cells are adapted for sensing electromagnetic radiation incident thereon. A plurality of sensor data amplifiers receives data from the cells. Means is provided for reading data from the cells into the sensor data amplifiers, and the sense amplifiers include an output circuit.

Preferably, the first transistor has the source/drain circuit thereof connected to a biasing potential with the gate electrode connected to a source of a precharge control signal.

Preferably, the second transistor has the source/drain circuit thereof connected to a the pixel sense amplifier and the second gate electrode is connected to a source of a sensing control control signal for activating reading of the cell.

Preferably, automatic gain control means is provided having an input connected to the output of the output sensor data amplifiers.

Preferably, automatic exposure control means is connected to an output of the sensor data amplifiers. A precharge circuit has an input connected to the output of the automatic exposure control means. The precharge circuit has an output coupled to precharge the gate of the first transistor.

Preferably, the sense amplifiers include a matched self-biasing circuit.

Preferably, the sense amplifiers include a first set of transistors connected to form an amplifier circuit and a self-biasing circuit including a second set of transistors connected in the same configuration as the first set to provide a continual current bias to the first set of transistors.

Preferably, the outputs of the sense amplifiers are connected through a multiplexing system to the input of an automatic gain control circuit; and the output of the sense amplifiers is connected to the input of an automatic gain control circuit.

Preferably, the automatic gain control circuit includes a programmable gain amplifier and a level detector both connected to receive the pixel data stream from the sense amplifiers, and a gain register connected to receive a gain adjustment signal from the level detector used to adjust the gain of the programmable gain amplifier.

Preferably, the automatic gain control circuit includes a programmable gain amplifier comprising a plurality of current mirror circuits connected in parallel providing a plurality of output signals.

Preferably, the plurality of output signals are connected to a summing circuit connected to a load resistor.

Preferably, a black level reference current is subtracted from each of the plurality of output signals in the summing circuit.

Preferably, automatic gain control means is provided having an input connected to the output of the output sensor data amplifiers.

Preferably, automatic exposure control means is connected to an output of the sensor data amplifiers. A precharge circuit has an input connected to the output of the automatic exposure control means. The precharge circuit having an output coupled to precharge the gate of the first transistor.

Preferably, the sense amplifiers include a matched self-biasing circuit; and the sense amplifiers include a first set of transistors connected to form an amplifier circuit and a self-biasing circuit including second set transistors connected in the same configuration as the first set to provide a continual current bias to the first set of transistors.

In accordance with this invention, a cell for an integrated circuit which functions as an image detector which provides an output signal representing a single pixel of a detected image, the integrated circuit is provided. A sensor cell comprising a doped semiconductor body doped with a first type of impurity, a central region formed in the body doped with an opposite type of impurity, and a pair of additional regions formed in the body doped with the opposite type of impurity. The pair of additional regions are formed in the body spaced away from the central region to form first and second MOSFET channel regions therebetween. A gate oxide layer is formed over the substrate including the pair of regions and the central region. A precharge transistor for precharging the cell having a precharge control gate electrode formed above the first channel region. The first control gate electrode extends between the central region and a first one of the pair of regions. A read transistor for reading charge from the photodiode having a sensing control gate electrode formed above the second channel region, the second control gate electrode extending between the central region and the other one of the pair of regions. A photodiode is formed at the interface between the substrate and the central region. The photodiode is exposed for sensing incident electromagnetic radiation.

Preferably, the first one of the regions is connected to a bias potential. The cell is adapted to be read at a read time. Means for providing coordinated timing control of precharge signals for the precharge control gate and sensing control signals for the sensing control gate. The precharge control gate is energized for an interval prior to the read time. The read gate is energized at the read time.

Preferably, the doped semiconductor body comprises a P-doped body, and the central region and the pair of adjacent regions are N+ doped regions.

In accordance with another aspect of this invention, a cell for an integrated circuit which functions as a black level calibration circuit for an image detector which provides an output signal representing a single pixel of a detected image, the integrated circuit is provided. A sensor cell comprises a doped semiconductor body doped with a first type of impurity, a central region formed in the body doped with an opposite type of impurity, and a pair of additional regions formed in the body doped with the opposite type of impurity, the pair of additional regions are formed in the body spaced away from the central region to form first and second MOSFET channel regions therebetween. A gate oxide layer is formed over the substrate including the pair of regions and the central region. A precharge transistor precharges the cell and has a precharge control gate electrode formed above the first channel region, the first control gate electrode extending between the central region and a first one of the pair of regions. A read transistor for reads charge from the photodiode having a sensing control gate electrode formed above the second channel region, the second control gate electrode extending between the central region and the other one of the pair of regions. A photodiode is formed at the interface between the substrate and the central region. The photodiode is shielded from being exposed for sensing incident electromagnetic radiation.

Preferably, the black level calibration circuit for the image detector comprises a sensor cell with a semiconductor body doped with a first type of impurity. A central region is formed in the body doped with an opposite type of impurity. A pair of additional regions is formed in the body doped with the opposite type of impurity, the pair of additional regions are formed in the body spaced away from the central region to form first and second MOSFET channel regions therebetween. A gate oxide layer formed over the substrate includes the pair of regions and the central region. A precharge transistor for precharging the cell has a precharge control gate electrode formed above the first channel region, the first control gate electrode extending between the central region and a first one of the pair of regions. A read transistor for reading charge from the photodiode has a sensing control gate electrode formed above the second channel region, the second control gate electrode extending between the central region and the other one of the pair of regions. A photodiode is formed at the interface between the substrate and the central region. The photodiode is shielded from being exposed for sensing incident electromagnetic radiation.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
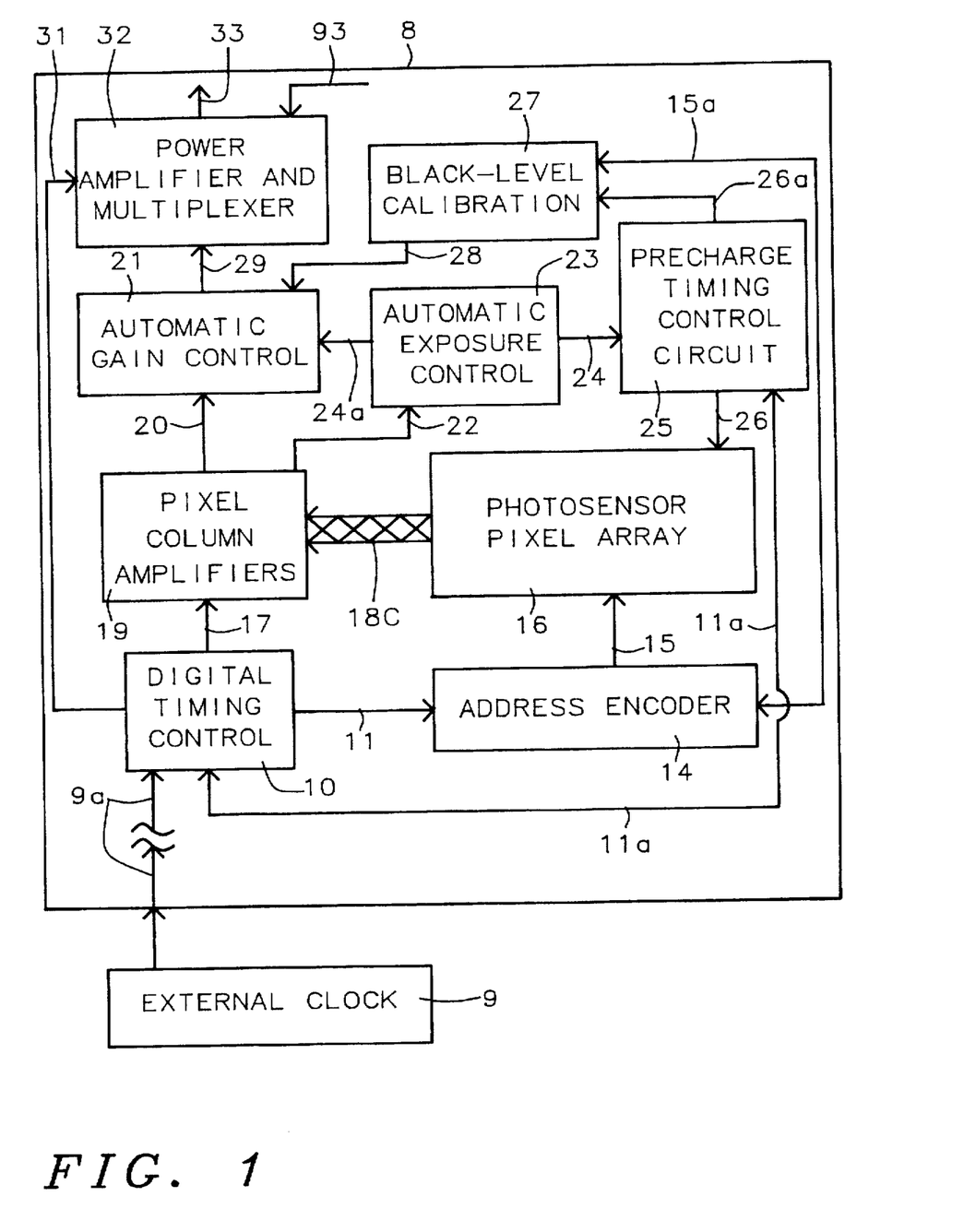
FIG. 1 shows the top level schematic, functional block diagram of an image detector system chip in accordance with this invention.

FIG. 1 shows the top level schematic, functional block diagram of an image detector system chip 8 in accordance with this invention. This image detector system chip 8 includes several sets of circuits including a CMOS photosensor pixel array 16, an Automatic Exposure Control (AEC) circuit 23 and an Automatic Gain Control (AGC) circuit 21.

The only critical electrical inputs to the entire chip 8 are a 5-volt source (AVD signal source, 1.1 V $V_{CC}$ or $V_{DD}$) and the associated ground line (AVS or $V_{SS}$) and a clock signal which may be derived from an external clock 9 which may be a quartz crystal resonator. The image chip 8 provides an output signal on line 33 comprising a composite video signal which contains the moving image information detected by the image detector chip 8. The video signal conforms to existing video standards (PAL, NTSC, SECAM) and thus the output signal on line 33 is adapted to be fed directly to a television video-in port.

In FIG. 1, a digital timing control circuit 10 provides timing output signals on lines 11, 11a, 17 and 31 and circuit 10 receives input on line 9a from an external clock 9. Those timing signals are provided to other circuits on the chip 8. In particular, line 11 is connected to provide conventional timing signals to a conventional address encoder 14. Line 11a provides conventional timing signals to a precharge timing control circuit 25. Line control 17 provides timing signals to an array of Pixel Column Amplifier (PCA circuits) 19 for synchronization of a multiplexer circuit therein. Line 31 is connected to an output power amplifier and multiplexer circuit 32 for synchronization of the multiplexer circuit therein.

The address encoder 14 responds to the timing signals on input line 11 to provide an output on line 15 containing address signals for the photosensor pixel array (PPA) 16. The address signals are sent in a conventional, scanning time sequence to operate the system in a coordinated fashion.

The address encoder 14 also sends signals to black-level calibration circuit 27.

Black-level calibration circuit 27 performs the function of providing a signal output on line 28 which indicates the equivalent signal strength from a photodiode PD' in complete darkness. Circuit 27 receives timing input signals on line 15a from timing control 10, signals from on line 26a from precharge timing control circuit 25, and an output on line 24 from AEC circuit 23.

Figure 2A:
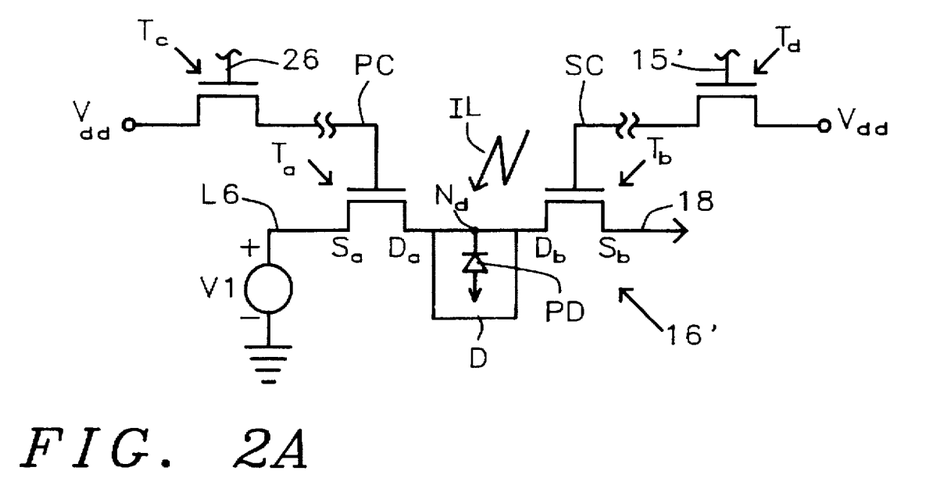
FIGS. 2A and 2B, show photosensor circuits in accordance with this invention.
Figure 2B:
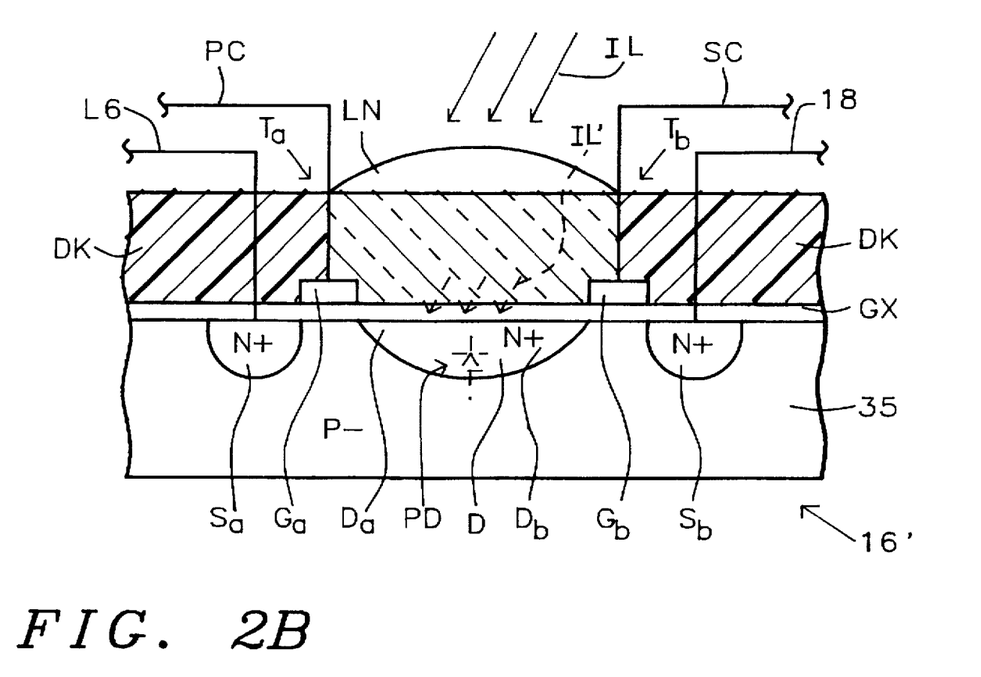
Figure 2C:
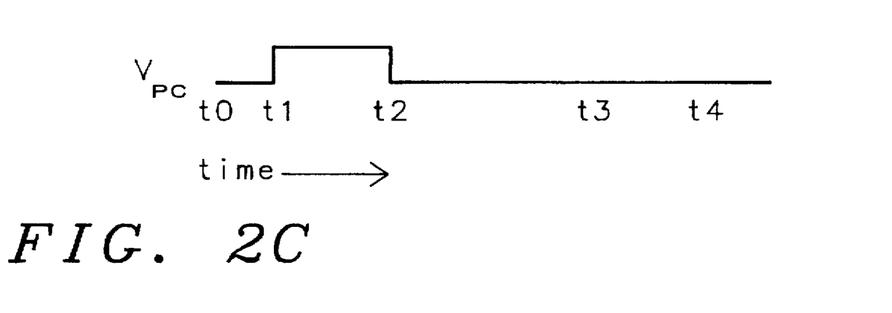
FIGS. 2C and 2D, show the timing signals of the precharge voltage signal PC and the sensing control voltage $V_{SC}$ of the photosensor circuits.
Figure 2D:
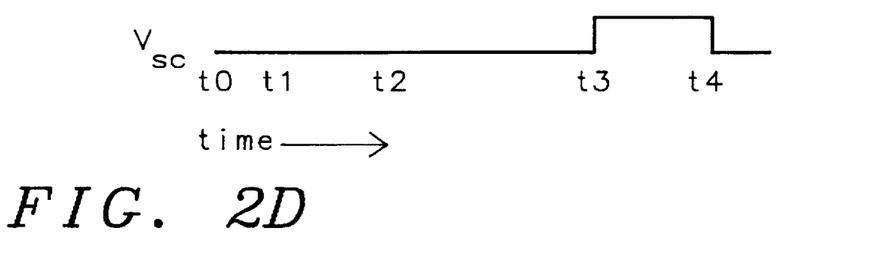

Photosensor pixel array (PPA) 16 includes an array of 312 columns and 287 rows of photosensor cells and associated circuits which are scanned by the address encoder signals on line 15. The outputs from PPA 16 are supplied on cable 18C to the Pixel Column Amplifiers 19. FIGS. 2A and 2B show an example of one of the photosensor cells 16' in PPA 16 which includes with its photodiode PD which is energized during the presence of illumination IL, as described in detail below. FIGS. 2A and 2B, show photosensor circuits in accordance with this invention. FIGS. 2C and 2D, show the timing signals of the precharge voltage signal PC and the sensing control voltage VSC of the photosensor circuit 16'.

Referring again to FIG. 1, whereas input line 15 from encoder 14 supplies the addressing signals to the photosensor pixel array (PPA) 16, as described above, a precharge voltage signal PC is supplied to PPA 16 on line 26 from precharge timing control circuit 25 during the time interval from time t1 to time t2 in FIGS. 2C and 2d during which time interval, the signal on line 26 switches remotely located transistors Tc and Tc' shown in FIG. 2A, as described below in greater detail in connection with FIGS. 2A–2C. Transistor Tc is turned on and transistor Tc' is turned off, and this energizes line PC, which turns on transistor Ta. During the other time intervals (t0 to t1 and t2 to t4), the signal on line 26 turns off transistor Tc and turns on transistor Tc', so that line PC is deenergized, and transistor $T_a$, is turned off.

The PPA 16 resembles a RAM (random access memory) in the way it is accessed. Referring to FIG. 2A, the bit line function is performed by the signal on line 18, while the word line function is performed by the voltage signal $V_{PC}$ on line PC (during the Write/Precharge) cycle, and voltage signal $V_{SC}$ on line SC (during the Read/Sense) cycle). The PPA 16 is read row by row sequentially. When a row is being read, the pixels in that row are scanned sequentially, i.e., column by column in the conventional manner.

Figure 3:
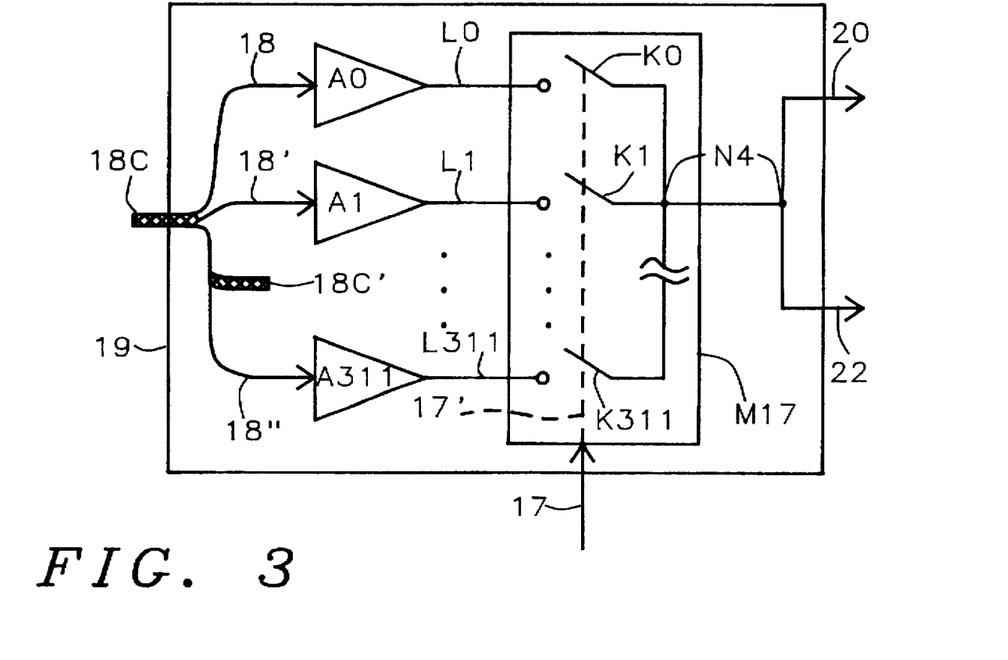
FIG. 3 shows a set of pixel column amplifiers, i.e. sense amplifiers, and an output interface which connects to the automatic gain control circuit which is shown in FIG. 5.
Figure 4:
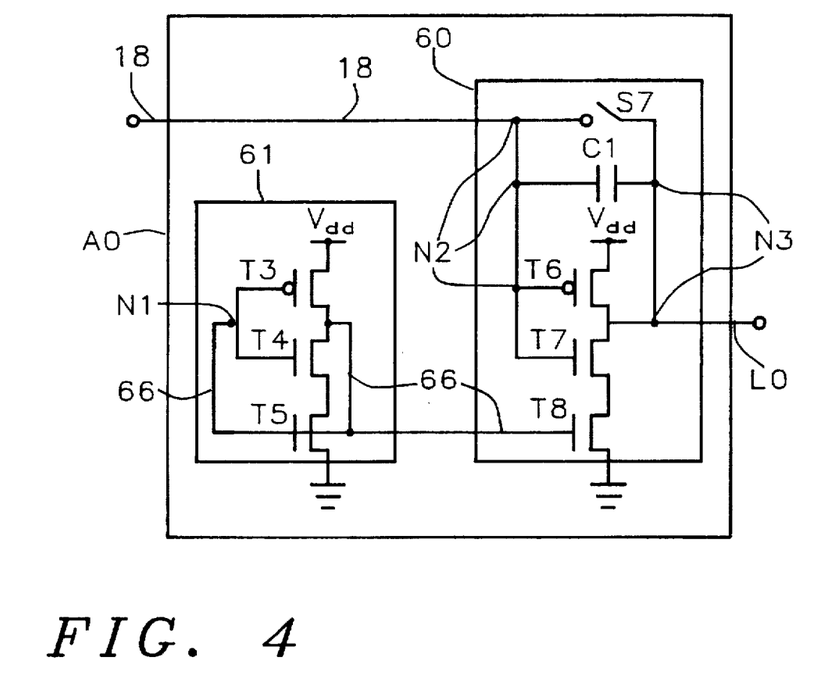
FIG. 4 shows pixel array column sense amplifiers for the system of FIG. 1 with one sense amplifier which is one of a set of identical pixel sense amplifiers in the block.

Referring to FIG. 1, PPA 16 has an output cable 18C. Cable 18C has 312 bit output lines which supply output signals from the 312 columns of sensors 16' in the PPA 16 to a matching set of 312 amplifiers in pixel column amplifiers (PCA circuit) 19, which are illustrated in FIGS. 3 and 4.

The PCA circuit 19 receives an array of input signals from the output cable 18C from pixel array 16. The PCA circuit 19 receives a timing input on the line 17 from digital timing control circuit 10. Referring to FIG. 3, each of the amplifiers A0, A1 ... A311 in PCA circuit 19 sequentially amplifies a signal from the pixels selected by the word line SC (FIG. 2A) in one column of sensors 16' (in array 16), column by column for each row to provide sequential pixel information on output line 20 to the AGC circuit 21, and the same information signals are also provided, via line 22 from amplifiers A0, A1 ... A311, to the Automatic Exposure Control (AEC) circuit 23. The AEC circuit 23 is able to determine the strength of exposure of the pixel array 16 from the maximal and minimal strengths of the sequential pixel information over a single frame, and can thus decide whether or not there is over-exposure or under-exposure of the pixel array 16, and whether to correct this over/under-exposure. The degree of exposure of the pixel array 16 can be controlled by adjusting the duration of the time interval from time t2 to time t3 in FIG. 2D.

There are 312 pixel sense amplifiers A0, A1 ... A311 in PCA 19. The outputs of the amplifiers A0, A1 ... A311 are selectively multiplexed through a single output node N4, as seen in FIG. 3. The output signals on lines 20 are passed through the AGC circuit 21 before being sent to an on-chip power amplifier and multiplexer circuit 32, which receives on line 31 a timing input signal from digital timing control 10.

Referring again to FIG. 1, the precharge timing control circuit 25 comprises a timing control circuit which processes signals comprising timing inputs received on line 11a from digital timing control circuit 10 and received on line 24 from AEC circuit 23. A first output line 26 from the precharge timing control circuit 25 goes to the PPA 16 as the WRITE-CYCLE word-line 26 connected to the control gates of a PMOS transistor $T_c$ and a NMOS transistor $T_c'$ as shown in FIG. 2A and as explained below herein in connection with FIG. 2A.

Pixel Array Photosensor Cell

Referring to FIGS. 2A–2D, in accordance with this invention, in order to simplify the decoding and timing logic, reading and writing to each photodiode PD in a pixel array cell 16' is achieved by having more than one transistor, e.g. control transistors $T_a$ and $T_b$ associated with the photodiode PD. In a typical MOS implementation, this scheme is realized by using transistors that share a common diffusion area D as their drains. The diffusion area D functions at the interface with the substrate or well 35 as the photodiode PD. In a contemporary process for 0.6 µm size device, the additional gate and source area required by having the two control transistors $T_a$ and $T_b$ does not significantly increase device size, since the additional areas required for the control transistors $T_a$ and $T_b$ are significantly smaller than the common drain-diffusion area.

FIG. 2A is an electrical schematic diagram of a portion of a single photosensor cell 16' in accordance with this invention, which is the preferred embodiment of this invention. Cell 16' is a component of the photosensitive pixel array 16 of FIG. 1.

FIG. 2B is a partially schematic, sectional view of an embodiment of the cell 16' of FIG. 2A, which is formed on a P-doped silicon semiconductor substrate 35 having a surface covered by a conventional dielectric layer GX comprising a silicon dioxide gate oxide (oxide) layer. The cell 16' includes MOS control transistors $T_a$ and $T_b$ and an incident-light sensor in the form of the photodiode PD formed in and on the P-doped silicon semiconductor substrate 35.

Referring to FIG. 2A, photosensor cell 16' serves as a detector for one pixel in the array of cells represented by photosensitive pixel array 16 in FIG. 1. Cell 16' comprises two MOS control transistors $T_a$ and $T_b$ and the photosensor comprises photodiode PD. The drain $D_a$ of the first control transistor $T_a$ and the drain $D_b$ of the second control transistor $T_b$ are both connected at node $N_d$ to the cathode (N type region) of the photodiode PD. The photodiode PD is a conventional photodiode formed by a P-N junction which is operated under reverse bias.

When an optical signal IL of radiation directed towards PPA 15 energizes the photodiode PD, the depletion region in the diode PD separates photogenerated electron-hole pairs, and an electric current flows in the external circuit from node $N_d$ to ground in the conventional manner of operation of a photodiode PD. The anode of the photodiode PD is connected to ground. The negative terminal of D.C. power supply source V1 (+3.0 Volts) is also connected to ground. The positive terminal of source V1 is connected via line L6 to the source $S_a$ of first control transistor $T_a$, so that when the control gate electrode (gate) of the first, precharge control transistor $T_a$ rises, the voltage V1 is applied to node $N_d$, which will precharge the node $N_d$ to an initial voltage V1, by means of showing a finite quantity of charge at node $N_d$. The gate of control transistor $T_a$ is connected to line PC which is connected to the junction of the drains of a PMOS transistor $T_c$ and an NMOS transistor $T_c'$. The source of PMOS transistor $T_c$ is connected to bias voltage $V_{DD}$ and the source of NMOS transistor $T_c'$ is connected to ground. To operate the first, control transistor $T_a$, the gate of transistor $T_a$ is controlled via application to the gates of transistors $T_c$ and $T_c'$ of a logic signal on line 26 from precharge timing control circuit 25. The precharge control voltage $V_{PC}$ at the gate of control transistor $T_a$ is described below in connection with the description of FIG. 2C, below.

The precharge control voltage $V_{PC}$ serves as the "write" control of the device 16'. The sensing control voltage $V_{SC}$ serves as the "read" control of the photosensor cell 16'. The gate of control transistor $T_b$ is connected to line PC to be controlled which by the voltage at the junction of the drains of PMOS transistor $T_d$ and a NMOS transistor $T_d'$. The source of PMOS transistor $T_d$ is connected to bias voltage $V_{DD}$ and the source of NMOS transistor $T_d'$ is connected to ground. The gates of PMOS transistor $T_d$ and NMOS transistor $T_d'$ are connected to be controlled by a logic signal on line 15' which is part of a cable 15 from address encoder 15. The voltage level VSC at the gate of transistor $T_b$ is described below in connection with the description of FIG. 2D.

FIG. 2C is an idealized diagram illustrating the trace of the precharge control voltage $V_{PC}$ amplitude shown as a function of time. Voltage $V_{PC}$ repeats in a cyclical pattern at the repetition rate of the photosensitive pixel array 16, as will be well understood by those skilled in the art. In FIG. 2C, starting at time t0, the voltage $V_{PC}$ remains at a quiescent value near zero and then at time t1, $V_{PC}$ rises sharply in a square wave to a positive voltage which persists from time t1 to time t2 which positive voltage turns on first control transistor $T_a$ so that it conducts current from source V1. At time t2, the voltage $V_{PC}$ drops sharply back to near zero turning control transistor $T_a$ off again.

The control gate electrode (gate) of the second, sensing control transistor $T_b$ is controlled via transistors $T_d$ and $T_d'$ by the logic signal on line 15'. Line 15' is a part of cable 15 connected from the address encoder 14 to provide the sensing control voltage to the photosensor cell 16'. The voltage trace of the sensing control voltage $V_{PC}$ is shown as a function of time in FIG. 2D. FIG. 2D is an idealized diagram illustrating the voltage amplitude trace of sensing control voltage $V_{PC}$ varying as a function of time. The same times t0, t1, t2 and t3 shown in FIG. 2C are indicated below the trace. Voltage $V_{PC}$ also repeats in a cyclical pattern at the repetition rate of the photosensitive pixel array 16, as will be well understood by those skilled in the art. FIG. 2D has the same time coordinates as FIG. 2C to show the time delay between the pulses which energize the gates of the control transistors $T_a$ and $T_b$.

When the time arrives for reading the voltage in a given cell 16, the voltage $V_{PC}$ rises sharply in a square wave to a positive value which persists from time t3 to time t4, to turn on transistor $T_b$. After time t4, the voltage $V_{PC}$ drops sharply back to zero thereby turning off transistor $T_b$. Note that time t3 occurs a substantial time interval after time t2, when voltage $V_{PC}$ drops, which gives node $N_d$ of the cell time 16' a time interval during which it can be discharged because of the intervening conduction of the photodiode PD from node $N_d$ to ground, if incident light IL hits the photodiode PD. On the other hand if no light IL strikes the photodiode PD during the time from t1 to time t3, then the voltage on node $N_d$ remains high and the voltage on line 18 remains near 3 Volts, and the charge remains on node $N_d$ during the time interval t2–t3.

In practice, the residual charge on node $N_d$ after the time interval t2–t3 varies inversely with the summed intensity of the incident light thereon during the timed interval t2–t3. Line 18, which comprises a portion of cable 18C in FIG. 1, is connected from the source $S_b$ of transistor $T_b$ to a corresponding one of the PCA circuit 19.

FIG. 2B shows the sensor cell 16' of FIG. 2A in an MOS n-channel photodiode implementation.

The control transistors $T_a$ and $T_b$ and the photodiode PD share a common, N+ doped, drain region D in the substrate 35. The common drain region D includes the drain $D_a$ of the first control transistor $T_a$, the N region (cathode) of the PN photodiode PD, and the drain $D_b$ of the second control transistor $T_b$. The common, N+ doped, drain region D (which was formed by diffusion) is left exposed through gate oxide layer GX and through optical lens LN to incident light IL so that photodiode PD can operate as a photodiode element. The P region of P-N photodiode PD comprises the P-substrate 35. A voltage source V1 (with a value of +3 Volts) shown in FIG. 2A is connected via line L6 to the source $S_a$ (formed in substrate 35) of control transistor $T_a$. The source $S_b$ (formed in substrate 35) of transistor $T_b$ is connected by line 18 to a line in cable 18 connected to the pixel column amplifier 19. The other end of power supply V1 is connected to ground.

Control transistor $T_a$ includes control gate $G_a$ formed over gate oxide layer GX which, in combination with source region $S_a$ and drain region $D_a$ in substrate 35, forms the MOSFET control transistor $T_a$. Control gate $G_a$ is connected to precharge control line PC. Control transistor $T_b$ includes control gate $G_b$ formed over gate oxide layer GX and a source region $S_b$ and the drain region $D_b$ in substrate 35 to form the MOSFET device $T_b$. Control gate $G_b$ is connected to precharge control line SC.

A field oxide masking layer DK covers the remainder of the cell 16' covering the surface of the gate oxide layer GX and a portion of the control electrode gates $G_a$ and $G_b$ of control transistors $T_a$ and $T_b$. The optical lens LN comprises a transparent polymer layer such as acrylate which can be formed by the process of chemical deposition and etching. Input light IL passes through lens LN and is received as transmitted light IL' at the photodiode PD.

It can be seen that line L6 reaches down through the masking layer DK and gate oxide layer GX to contact the source $S_a$, and that line 18 reaches down through the masking layer DK and gate oxide layer GX to contact the source $S_b$. Line 18 which comprises a portion of cable 18C in FIG. 1 is connected from the source $S_b$ of transistor $T_b$ to the input of one of the amplifiers in pixel column amplifier amplifiers 19.

The dimensions of photodiode PD viewed from the surface of the substrate 35 fall within a range of widths of between about 5 µm and about 15 µm and an equal range of lengths of about 5 µm and about 15 µm. The capacitance is between about 20 femtoFarads and about 50 femtoFarads. The leakage current is generally between about 1 nanoAmpere and about 400 nanoAmperes, depending on the intensity of the incident light IL.

The sensor array 16 in FIG. 1 is configured like a memory (e.g. ROM) array. The analog information stored in each basic cell (e.g. cell 16') in the array 16 is a measure of the light intensity on that picture element (pixel). The array of information is scanned line-by-line, using sensing control circuits, including the address encoder 14, to select the required pixels.

In the preferred embodiment the information detected by each of the photosensors 16' is amplified in pixel column amplifiers 19 by a long column of 312 Sense Amplifiers (A0, A1, ... A311) shown in FIG. 3 before the signal goes to the Automatic Gain Control circuit 21 seen in FIG. 5.

Pixel Sense Amplifiers and Output Interface (PCA)

FIG. 3 shows the block diagram of the PCA circuit 19 which receives an array of inputs in parallel on cable 18C from the PPA 16 and which also receives digital timing signals on line 17 from digital trimming control 10. PCA circuit 19 supplies multiplexed outputs on lines 20 and 22 to the AGC circuit 20 and AEC circuit 23. PCA circuit 19 comprises a set of sense amplifiers A0, A1, ... A311 and a multiplexer M17 output interface which provides output signals on line 20 to one input of the AGC circuit 21 and also supplies an output on line 22 to the input of AEC circuit 23. PCA circuit 19 is adapted to provide an output signal representing each line of scanned information, which is multiplexed pixel by pixel on line 20 to the automatic gain control circuitry 21 in FIG. 5. The multiplexing by multiplexer M17 of pixel information from the output lines L0, L1, ... L311 of the sense amplifiers A0, A1, ... A311 is performed by sequential operation of electronic switches indicated for convenience of illustration by the knife switch symbols K0, K1, ... K311 in a conventional multiplexing system. Digital timing signals on line 17 provide timing for the multiplexing of the switches K0, K1, ... K311, which is indicated by the phantom line from timing control line to those switches which will operate in a way well known to those skilled in the art.)

The outputs from all of the switches K0, K1, ... K311 of multiplexer M17 are connected through a common node N4 to output line 20 where the multiplexed data which comprises a pixel information stream which is transmitted to the input of the AGC circuit 21 shown in FIG. 5.

Operation of an individual pixel column sense amplifier is the same for each of the sense amplifiers A0, A1, ... A311.

The input signal on line 18 to the first sense amplifier circuit A0 shown in FIG. 4 is connected via cable 18C to the input of the PCA circuits 19. Cable 18C includes 312 lines 18, 18' . . . 18C' . . . 18" supplying signals from circuit 16 to the respective inputs of sense amplifiers A0, A1, . . . A311 in PCA circuit 19.

Pixel Array Column Sense Amplifier A0

FIG. 4 shows one sense amplifier A0 which is one of a set of 312 identical pixel sense amplifiers A0, A1, . . . A311 in the block 19. The input to the sense amplifier A0 is provided via output line 18 in cable 18C from one of the pixel photosensor cells 16' in FIGS. 2A and 2B. A feature which is an advantage of the sense amplifier A0 is that it is self-biased. That advantage is implemented by providing each of the sense amplifiers A0, A1, . . . . . A311 with a self-biasing circuit. Each sense-amplifier A0, A1, . . . A311 has its own dedicated, matching FET bias circuit which comprises a matched, constant current, bias circuit 61. The matchedbias circuit 61 includes a three transistor amplifier composed of FET transistors which provide a constant bias current on line 66 to the sense amplifier 60 with which it is associated. The proximity of the matched-bias circuit 61 to the sense amplifier 60 ensures process matching between the sense amplifier 60 and matched-bias circuit 61. This allows the overall sense amplifier A0 to operate at, or near, its point of highest gain.

The constant current, matched-bias circuit 61 includes a set of three FET transistors including PMOS transistor T3, NMOS transistor T4, and NMOS transistor T5 with the S/D circuits thereof connected in series between the bias voltage source Vdd and ground. The gates of transistors T3, T4 and T5 are connected together at node N1, which is also connected to the junction of the drains of transistors T3 and T4. Node N1 is connected to the output line 66 of constant current circuit 61. From a different point of view, node N1 is connected via line 66 to the drain connection between transistors T3 and T4, as well as, being connected to the control gate electrodes of all three transistors T3, T4, and T5.

Sense amplifier 60 is connected by input line 18 of cable 18C to receive signals from the PPA 16. Input line 18 is connected to a node N2 in sense amplifier 60. Sense amplifier 60 includes three transistors T6, T9 and T8 which are matched with transistors T3, T4 and T5 of circuit 61. Like circuit 61, PMOS transistor T6, NMOS transistor T7, and NMOS transistor T8 have a set of S/D circuits connected in series between the bias voltage source Vdd and ground. The drains of PMOS transistors T6 and NMOS transistor T7 are connected together at node N3. In addition, the control gate of transistor T8 in amplifier 60 is connected to the output on line 66 from node N1 of constant current amplifier matched-bias circuit 61. Transistors T6, T9 and T8 of circuit 60 are matched with transistors T3, T4 and T5 of circuit 61.

Each sense amplifier 60 includes a set of three FET transistors T6, T7, and T8 (matched to transistors T3, T4, and T5) with the S/D circuits thereof connected in series between bias circuit vdd and ground. Transistor T6 is a PMOS device and the other two transistors T7 and T8 are NMOS devices. The gate electrodes of transistors T6 and T7 are connected to node N2, which is connected to the input line 18 from the photosensitive pixel array 16. The S/D circuits of transistors T6 and T7 are connected to node N3. A capacitor C1 is connected between nodes N2 and N3. In addition, a conventional electronic switch S7, illustrated as a knife switch for convenience of illustration, is connected between nodes N2 and N3. The output of amplifier 60 provides an amplified voltage output via line L0, which comprises the output of amplifier A0 (as shown in FIG. 3.)

The mode of operation of the sense amplifier A0 is described next. Subcircuit 61 is a bias circuit which provides a constant gate voltage via line 66 to the gate electrode of transistor T8 in sense amplifier 60. This setup causes a nearly constant bias current to flow between the S/D terminals of transistor T8.

The sense amplifier 60 is an inverting voltage amplifier. Before each sensing cycle, there is a "set-up" cycle in which switch S7 is turned on, and node N2 is at a high impedance level, because the pixel charge is not yet applied through cable element 18. During this portion of the cycle, the nodes N3 and N2 are shorted together when switch S7 is turned on, and the amplifier 60 is briefly balanced in a high-gain state.

Then switch S7 is turned off and the pixel charge is applied through cable element 18. The application of the pixel charge, if any, causes the voltage at the input node N2 to change.

The inverting configuration of amplifier 60 then causes output line L0 to be driven to a voltage level corresponding to the voltage at node N2.

In summary, the input to sense amplifier 60 includes the output line 18 from a photosensor cell 16' which is connected via a node N2 in FIG. 4 to the control gate electrodes of S/D series connected transistors T6 and T7. The S/D circuits of transistors T6 and T7 are connected in series between bias circuit Vdd and the drain of transistor T8, which is connected at its source to ground; with the drains of transistors T6 and T7 being connected together. Line 66 from matched-bias circuit 61 provides the continual current bias to the control gate of transistor T8, from the bias on node N1 in matched-bias circuit 61.

Figure 5:
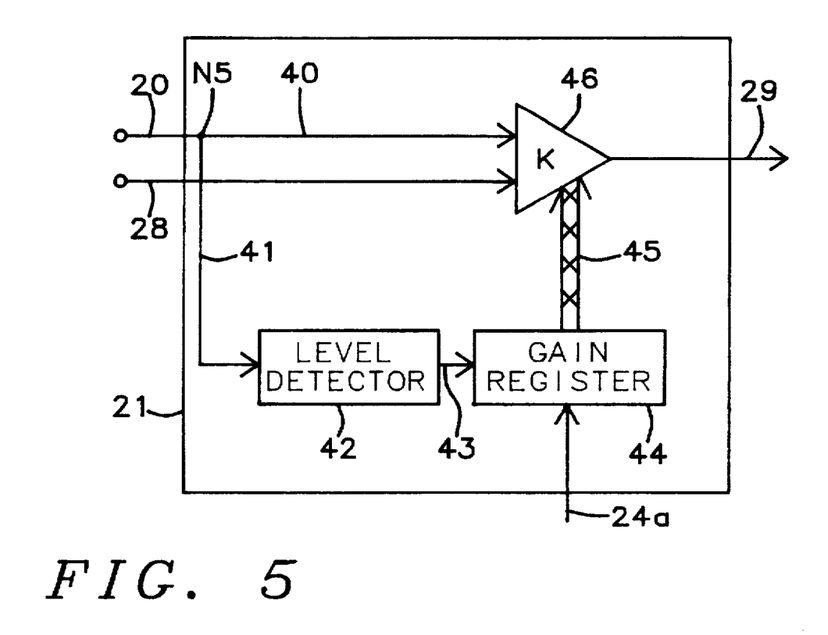
FIG. 5 shows block diagram of an Automatic Gain Control (AGC) circuit in accordance with this invention which includes a Programmable Gain Amplifier (PGA) a level detector and a gain register.
Figure 6:
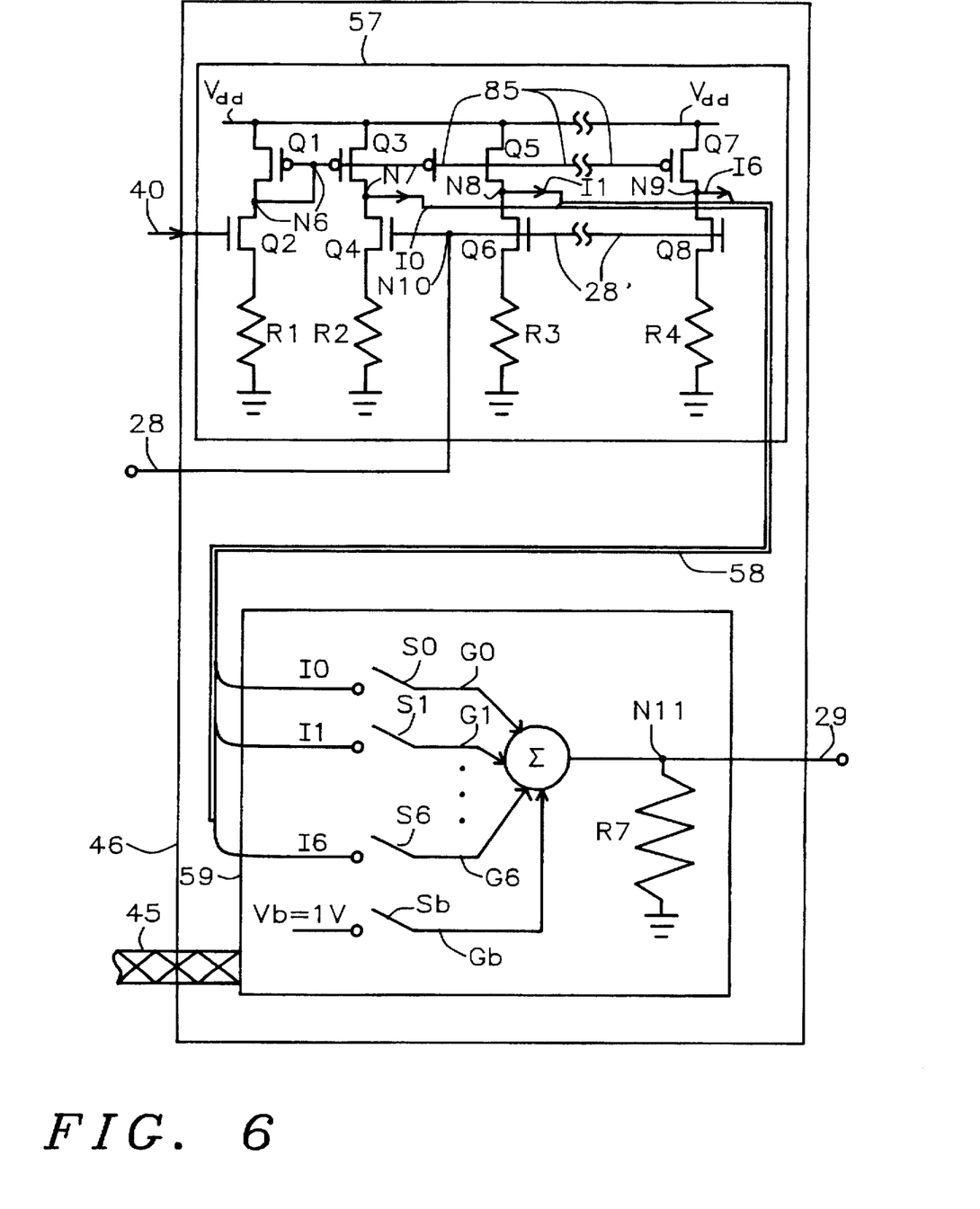
FIG. 6 shows the block diagram of the Programmable Gain Amplifier (PGA) shown in FIG. 5.

Referring again to FIG. 3, the pixel information voltage signal, the voltage of which has been pre-amplified by the column sense-amplifiers 19, as described above in connection with FIG. 3, is multiplexed via node N4 and line 20 to the AGC circuit 21 which includes a Programmable Gain Amplifier 46 seen in FIGS. 5 and 6.

Automatic Gain Control Circuit

FIG. 5. shows the overall block diagram of the AGC circuit 21. The function of automatic gain control is performed (on the chip 8) using dynamic measurement by the level detector 42 of the maximum amplitude of the pixel information signal on line 20 from PCA circuits 19 to adjust to provide the appropriate adjustable gain level of K. Line 20 connects to node N5 in the AGC circuit 21. Node N5 connects to line 40 to the PGA 46 and through line 41 to the input of level detector 42 which provides an output signal on line 43 which varies as a function on the maximum previously measured voltage value of the pixel information stream. Black level calibration line 28 also connects to PGA 46.

The output of detector 42 is supplied on line 43 as a gain adjustment signal signal to the input of the gain register circuit 44. Gain register 44 stores the value of the signals as adjustable gain level of K which is supplied on output on bus 45 to the Programmable Gain Amplifier (PGA) 46. That is to say that the PGA 46 is supplied on digital 7-bit bus 45 with the adjustable gain level value K; and, adjustable gain level value K may take any non-zero 7-bit value, as described above. The value of K is determined dynamically by the feedback mechanism on the chip 8 which adjusts K to get a suitably amplified signal gain at line 29. Line 24a supplies register 44 with a signal from AEC circuit 23 signal.

Figure 9:
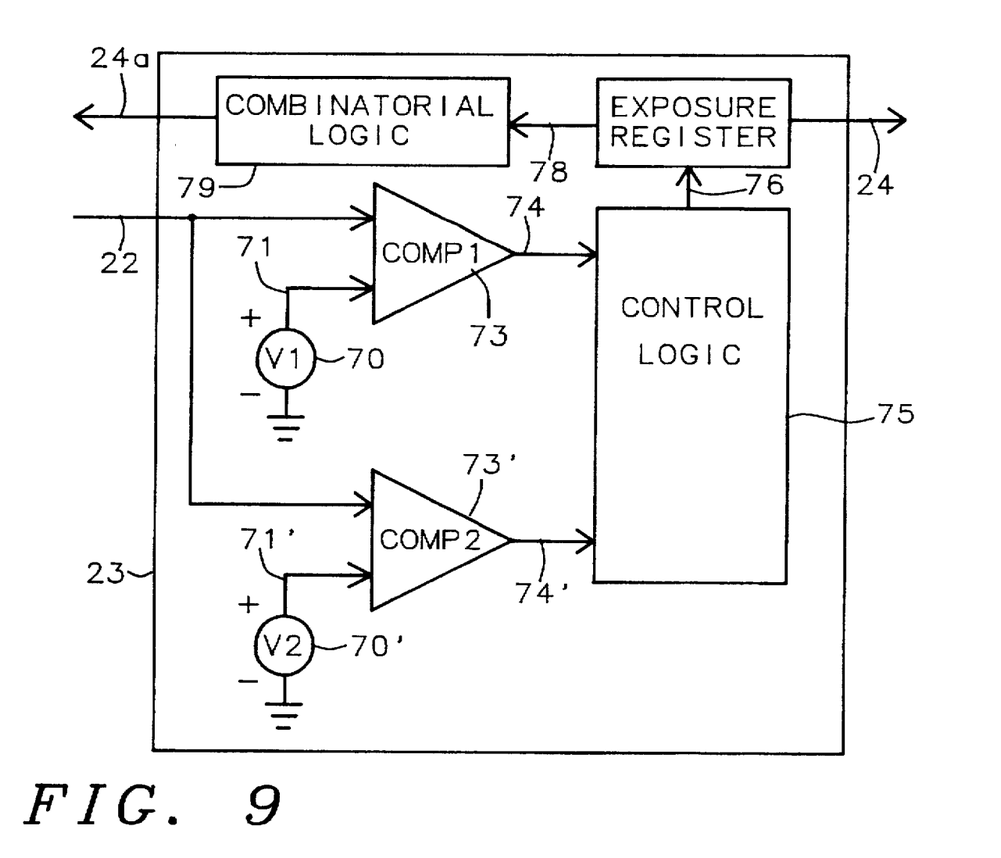
FIG. 9 shows an Automatic Exposure Control (AEC) circuit adapted for use in the system of FIG. 1.

The signal on line 24a indicates whether the exposure register 77 in the AEC circuit 23 in FIG. 9 has reached its maximum or minimum allowed value.

Programmable Gain Amplifier

The PGA 46 of FIG. 5, which is shown in detail in FIG. 6, comprises two circuits comprising a current mirrors circuit 57 and a signal summing circuit 59 between input line 40 and output line 29.

The pixel information which has been pre-amplified by the column sense-amplifiers 19 has then been multiplexed to AGC 21 where it reaches the PGA 46 as a voltage input signal on line 40. The PGA 46 amplifies the voltage signal by the adjustable gain value of K.

Referring to the current mirror circuits 57, line 40 is connected to the gate of NMOS transistor Q2, the source of which is connected through resistor R1 to ground, so that a positive pixel signal will turn on transistor Q2, permitting current to flow therethrough, raising the potential on the source of transistor Q2 because of the IR voltage across resistor R1. The drain of transistor Q2 is connected at node N6 to both the drain and the gate of PMOS transistor Q1. The source of transistor Q1 is connected to bias voltage Vdd.

Since the gate of transistor Q1 is also connected to node N6, it will be low when transistor Q2 is off, keeping PMOS transistor Q1 on. A series of seven PMOS transistors Q3, Q5, ... Q7 is connected drain to drain at seven nodes N7, N8, ... N9 to corresponding NMOS transistors Q4, Q6, ... Q8. The sources of those seven PMOS transistors Q3, Q5, ... Q7 are connected to bias voltage Vdd. The sources of the seven NMOS transistors Q4, Q6, ... Q8 are connected through seven corresponding resistors R2, R3 ... R4 respectively to ground. The seven resistors R2, R3 ... R4 have values of about 2,000 ohms. The gates of PMOS transistors Q3, Q5, ... Q7 are all connected via line 85 to node N6. The gates of the array of seven NMOS transistors Q4, Q6, ... Q8 are connected through line 28' and node N10 to black level calibration line 28. The black level reference current on line 28 is subtracted from each of the seven branches connected to node N10. Outputs from the current mirror circuits 57 are provided from the nodes N7, N8, ... N9 on seven lines I0, I1, ... I6 included within the cable 58 which connects to the signal summer circuit 59.

Where the other end of cable 58 connects to the input of the signal summer circuit 59, lines I0, I1, ... I6 connect respectively to switches S0, S1, ... S6 which connect respectively via lines G0, G1, ... G6 which connect into the current summing circuit E, which also receives the voltage source Vb=1V which is connected thereto through switch Sb and line Gb. Switches S0, S1, ... S6, Sb are shown as knife switches for convenience of illustration. The current is selectively summed by current summing circuit Σ (which is a conventional current summing circuit), depending on the adjustable gain-level setting, K on bus 45. As K is a 7-bit value, if the ith bit of K is logic HI, the corresponding switch Si is closed. The output of current summing circuit Σ is connected to node N11 and to one end of line 29 and across a high-impedance load R7 connected between node N11 and ground.

Current mirror circuit 57 shown in FIG. 6 operates in the manner described next. The current in FET NMOS transistor Q2 is determined by the voltage applied to its gate electrode through line 40. The current through transistor Q2 also flows through PMOS transistor Q1 S/D and through the resistor R1 connected to its source. PMOS transistors Q1, Q3, Q5, and Q7 are matched transistors having their sources connected in parallel to voltage source VDD. PMOS transistors Q3, Q5, and Q7 have their S/D circuits connected in parallel between voltage source VDD and matching NMOS transistors Q4, Q6, and Q8 with matching load resistors R2, R3, and R4 to ground respectively. This means that the same current will flow through each of these transistors Q1, Q3, Q7. The current that flows through transistor Q3 will flow into either of two branches. Some of it will flow through NMOS transistor Q4 connected in series therewith; while the remaining current is shunted through line I0 to the signal summer circuit 59 the shown in FIG. 6. Hence the current through I0 is proportional to the voltage at line 40. The same concept applies to the mirrored current in transistors Q5, ... Q7 (and the other transistors not shown in the array of seven bits) matched to transistor Q1 which current passes via lines I1 ... I6 to switches S1 ... S6 respectively in circuit 59.

If switch S0 is closed, then the current in line I0 is added in the current summing circuit. The state of switches S0–S6 is controlled by the programmable gain K (adjustable gain-level setting) of the PGA circuit. As gain level K increases, more of the switches S0-S6 are closed, and more current is summed. The summed current is hence proportional both to the gain K of the PGA, as well as the voltage level at line 40. This summed current is converted to a voltage (IR) signal at node N11 connected to one end of line 29, so the voltage signal is output to the terminal at the end of line 29 with a high-impedance load R7 connected between node N11 and ground.

Automatic Gain Control Circuit

Automatic Gain Control (AGC) circuit 21 is shown in block diagram form in FIG. 5. The AGC circuit 21 has an input line 20 supplying the output signals from PCA circuit 19, as well as, another input line 28 from black level calibration circuit 27. The AGC circuit 21 provides a processed output signal on output line 29. Output line 29 is connected to the input of power amplifier and multiplexer circuit 32 to supply the processed output signal from AGC circuit 21 thereto.

FIG. 6 shows the programmable gain amplifier circuit 46 which is part of the AGC circuit 21 which is described in greater detail below. Circuit which 46 has inputs on lines 28, 40 and 45 provides an output on line 29.

Power Amplifier and Multiplexer

Figure 7:
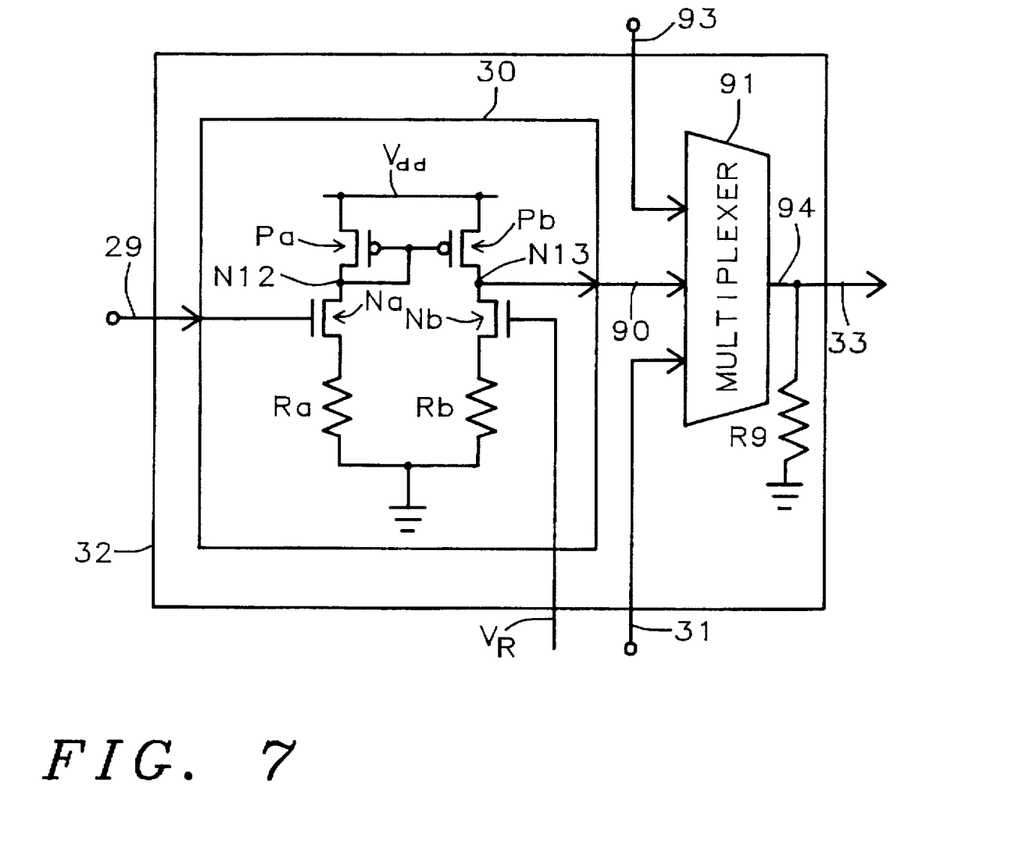
FIG. 7 is a detailed schematic diagram of a power amplifier circuit in the system of FIG. 1.

FIG. 7 is a detailed schematic diagram of power amplifier and multiplexer circuit 32, which includes power amplifier 30, multiplexer 91 and load resistor R9. Circuit 32 receives an input on line 29 from AGC circuit 21, and is connected to reference voltage line $V_R$, to synchronizing input 31 from digital timing control circuit 10, and to black input line 93. Amplifier and multiplexer circuit 32 provides a composite video signal on output line 33.

Amplifier 30 comprises an on-chip power amplifier which enables the chip 8 of FIG. 1 to drive a standard television load with an analog (current) video signal on output line 90. Amplifier 30 includes a pair of PMOS transistors Pa and Pb having their sources connected to bias voltage $V_{dd}$ and their drains connected to nodes N12 and N13 respectively. Nodes N12 and N13 are also connected to the drains of a pair of NMOS transistors Na and Nb respectively. The gates of transistors Pa and Pb are both connected to the node N12. The gate of NMOS transistors Na is connected to input line 29 from AGC circuit 21. The gate of NMOS transistor Nb is connected to a reference voltage $V_R$. The sources of NMOS transistors Na and Nb are connected through resistors Ra and Rb respectively to ground. Node N13 is connected to supply on line 90 the output signal from amplifier 30 comprising an analog video signal which is supplied via line 90 to one of an input of multiplexer 91.

In addition to the analog video signal on line 90 multiplexer 91 receives a synchronizing input 31 from digital timing control circuit 10, and the input from black input line 93. The analog, video signal from line 90 is selectively multiplexed with synchronization signals to output a television/monitor-ready composite video signal on line 94 across one end of load resistor R9 to the output line 33 from circuit 32. Load resistor R9 (37.5 ohm) is connected between line 94 and ground.

Automatic Exposure Control Circuit

As stated above, amplifiers A0, A1 ... A311 also provide an equivalent output signal on line 22 to the AEC circuit 23. The AEC circuit 23 shown in FIG. 9 processes the signal on line 22 using comparators 73, 73' which supply inputs on lines 74, 74' to a control logic circuit 75. The comparators 73, 73' have inputs connected to line 22 to compare the signal on line 22 (from circuit 19) against fixed voltage level V1 supplied to source 70 via line 71 and fixed voltage level V2 supplied to source 70' via line 71' to determine whether, if at all, the PPA 16 is over-exposed or underexposed.

The outputs from the comparators 73, 73' are fed to a control logic circuit 75 which provides an output on line 76 to adjust the value in the exposure register 77 in AEC circuit 23. The output signal on line 24 from exposure register 77 is sent via line 24 to the second input to precharge timing control circuit 25.

Another output signal from exposure register 77 is sent on line 78 to be processed by the combinatorial logic circuit 79 within the AEC circuit 23 which supplies an output signal on line 24a to the second input to AGC circuit 21. The output line 24a from logic circuit 79 carries a signal to the AGC circuit 21. The signal on line 24a indicates whether the exposure register 77 has reached its maximum or minimum allowed value.

Black Level Calibration Circuit

Referring to FIGS. 1 and 10, 11A and 11B, the black-level calibration circuit 27 performs the function of providing a signal output on line 28 which indicates the equivalent signal strength from a photodiode PD' in complete darkness.

The pixel column amplifier 27b amplifies the signal 18a from the dummy photosensor circuit 27a. The structure of the pixel column amplifier 27b is identical to the structure of the pixel array column sense amplifiers shown in FIG. 4 and described in detail below, which is incorporated here by reference. The amplified signal L0a from pixel column amplifier 27b is sent on line 28 to the Automatic Gain Control block 21.

Figure 10:
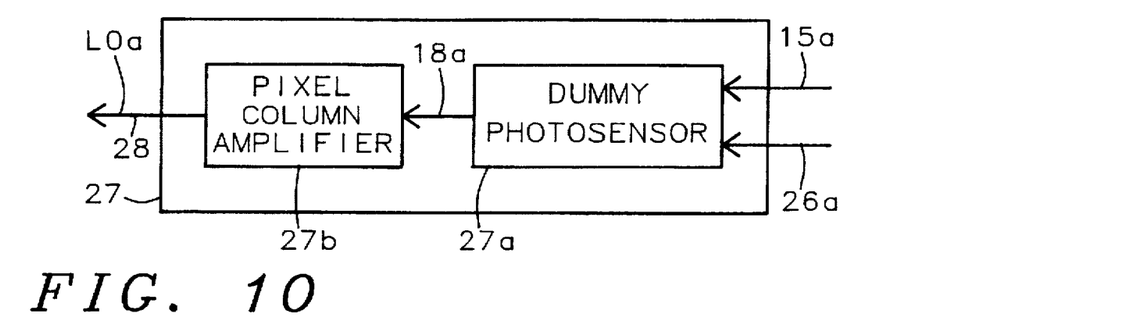
FIG. 10 shows a black-level calibration circuit with a dummy photosensor circuit and a pixel column amplifier.

Referring to FIG. 10, the black-level calibration circuit 27 comprises a dummy photosensor circuit 27a with input lines 15a and 26a and a pixel column amplifier 27b connected through line 18a from dummy photosensor circuit 27a.

Figure 11A:
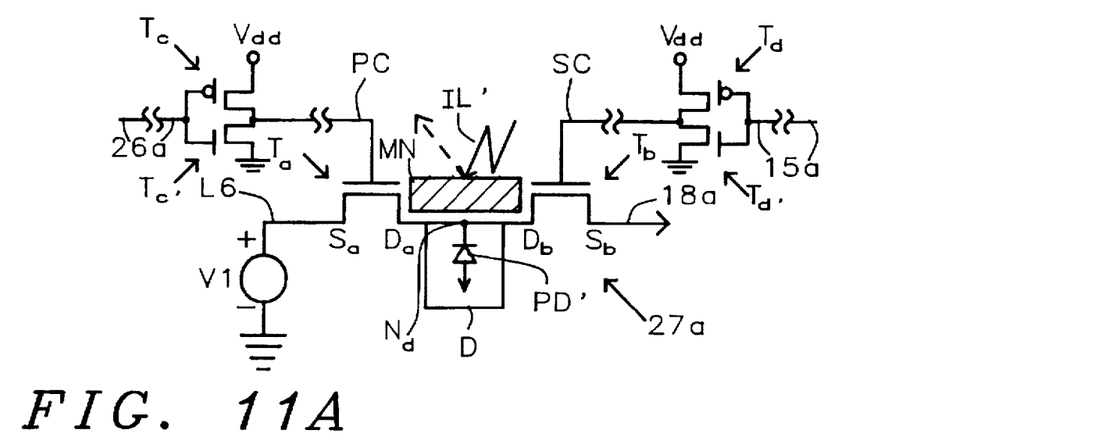
FIGS. 11A and 11B shows a dummy photosensor circuit resembling the regular photosensor circuit shown in FIGS. 2A and 2B.
Figure 11B:
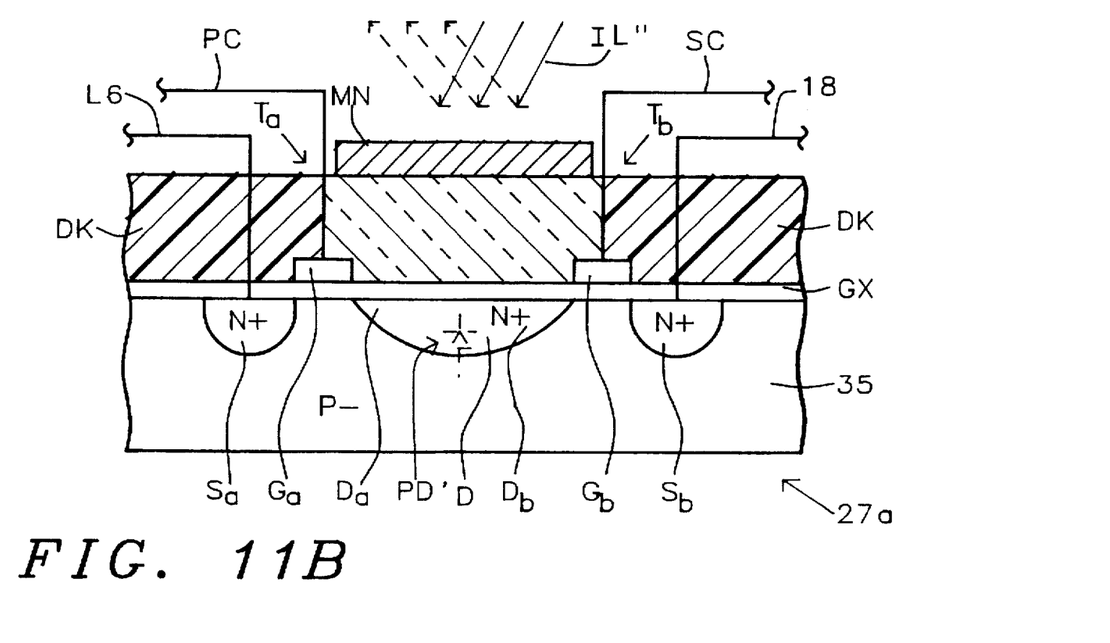

The dummy photosensor circuit 27a shown in detail in FIGS. 11A and 11B resembles a regular photosensor circuit 16' as seen in FIGS. 2A and 2B except that the photosensitive area, where photodiode PD" is located, is covered by one or more layers of metal MN (semi-opaque layers). This prevents most of the incident light IL" from reaching the photodiode PD', and thus dummy photosensor circuit 27a provides a signal reference on line 18a which corresponds to a signal on line 18 from a regular photosensor circuit 16' of a diode PD in FIGS. 2A and 2B which is in total darkness.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An integrated circuit which functions as an image detector which provides an output signal representing the detected image, said integrated circuit comprising:

a two dimensional array of sensor cells formed in rows and columns, digital timing control means with outputs there-from for providing timing signals, an address encoder, coupled to receive timing control signals from said digital timing control means, each said sensor cell having a photodiode and a first transistor having a first gate and having a source/drain circuit for precharging said cell and a second transistor having a second gate and a source/drain circuit for reading from said photodiode, said first transistor source/drain circuit is connected to a biasing potential with said first gate connected to a precharge control signal source, said sensor cells being adapted for sensing electromagnetic radiation incident thereon, a plurality of sensor data amplifiers for receiving data from said cells, means for reading data from said cells into said sensor data amplifiers, and said sensor data amplifiers including an output circuit.

2. An integrated circuit in accordance with claim 1 wherein said second transistor has said source/drain circuit thereof connected to a said pixel sense amplifier and said second gate electrode connected to a source of a sensing control control signal for activating reading of said cell.

3. An integrated circuit in accordance with claim 1 wherein automatic gain control means is provided having an input connected to said output circuit of said output sensor data amplifiers.

4. An integrated circuit which functions as an image detector which provides an output signal representing the detected image, said integrated circuit comprising:

a two dimensional array of sensor cells formed in rows and columns, digital timing control means with outputs there from for providing timing signals, an address encoder, coupled to receive timing control signals from said digital timing control means, each said sensor cell having a photodiode and a first transistor having a first gate and having a source/drain circuit for precharging said cell and a second transistor having a second gate and a source/drain circuit for reading from said photodiode, said sensor cells being adapted for sensing electromagnetic radiation incident thereon, a plurality of sensor data amplifiers for receiving data from said cells, means for reading data from said cells into said sensor data amplifiers, said sensor data amplifiers including an output circuit, automatic exposure control means being connected to an output of said sensor data amplifiers, a precharge circuit having an input connected to the output of said automatic exposure control means, and said precharge circuit having an output coupled to precharge said gate of said first transistor.

5. An integrated circuit in accordance with claim 1 wherein said sensor data amplifiers include a matched self-biasing circuit.

6. An integrated circuit which functions as an image detector which provides an output signal representing the detected image, said integrated circuit comprising:

a two dimensional array of sensor cells formed in rows and columns, digital timing control means with outputs there from for providing timing signals, an address encoder, coupled to receive timing control signals from said digital timing control means, each said sensor cell having a photodiode and a first transistor having a first gate and having a source/drain circuit for precharging said cell and a second transistor having a second gate and a source/drain circuit for reading from said photodiode, said sensor cells being adapted for sensing electromagnetic radiation incident thereon, a plurality of sensor data amplifiers for receiving data from said cells, means for reading data from said cells into said sensor data amplifiers, said sensor data amplifiers including an output circuit, said sensor data amplifiers include a first set of transistors connected to form an amplifier circuit and a self-biasing circuit including a second set of transistors connected in the same configuration as said first set to provide a continual current bias to said first set of transistors.

7. An integrated circuit in accordance with claim 7 wherein the outputs of said sense amplifiers are connected through a multiplexing system to the input of an automatic gain control circuit.

8. An integrated circuit in accordance with claim 1 wherein the output of each of said sensor data amplifiers is connected to the input of an automatic gain control circuit.

9. An integrated circuit in accordance with claim 8 wherein said automatic gain control circuit includes a programmable gain amplifier and a level detector both connected to receive the pixel data stream from said sense amplifiers, and a gain register connected to receive a gain adjustment signal from said level detector used to adjust the gain of said programmable gain amplifier.

10. An integrated circuit in accordance with claim 8 wherein said automatic gain control circuit includes a programmable gain amplifier comprising a plurality of current mirror circuits connected in parallel providing a plurality of output signals.

11. An integrated circuit in accordance with claim 10 wherein said plurality of output signals are connected to a summing circuit connected to a load resistor.

12. An integrated circuit in accordance with claim 11 wherein a black level reference current is subtracted from each of said plurality of output signals in said summing circuit.

13. An integrated circuit in accordance with claim 12 wherein automatic gain control means is provided having an input connected to the output of said output sensor data amplifiers.

14. An integrated circuit in accordance with claim 13 wherein automatic exposure control means is connected to an output of said sensor data amplifiers, a precharge circuit having an input connected to the output of said automatic exposure control means, said precharge circuit having an output coupled to precharge said gate of said first transistor.

15. An integrated circuit in accordance with claim 13 wherein said sense amplifiers include a matched self-biasing circuit.

16. An integrated circuit in accordance with claim 15 wherein said sense amplifiers include a first set of transistors connected to form an amplifier circuit and a self-biasing circuit including second set transistors connected in the same configuration as said first set to provide a continual current bias to said first set of transistors.

17. An integrated circuit in accordance with claim 16 wherein the outputs of said sense amplifiers are connected through a multiplexing system to the input of an automatic gain control circuit.

18. A cell for an integrated circuit which functions as an image detector which provides an output signal representing a single pixel of a detected image, said integrated circuit comprising:

a sensor cell comprising a doped semiconductor body doped with a first type of impurity, a central region formed in said body doped with an opposite type of impurity, and a pair of additional regions formed in said body doped with said opposite type of impurity, said pair of additional regions being formed in said body spaced away from said central region to form first and second MOSFET channel regions therebetween, a gate oxide layer formed over said substrate including said pair of regions and said central region, a precharge transistor for precharging said cell having a precharge control gate electrode formed above said first channel region, said first control gate electrode extending between said central region and a first one of said pair of regions, said sensor cell including a photodiode, a read transistor for reading charge from said photodiode having a sensing control gate electrode formed above said second channel region, said second control gate electrode extending between said central region and the other one of said pair of regions, said photodiode formed at the interface between said substrate and said central region, and said photodiode being exposed for sensing incident electromagnetic radiation.

19. A cell in accordance with claim 18 wherein said first one of said regions is connected to a bias potential, said cell being adapted to be read at a read time, means for providing coordinated timing control of precharge signals for said precharge control gate and sensing control signals for said sensing control gate, said precharge control gate being energized for an interval prior to said read time, and said read gate being energized at said read time.

20. A cell in accordance with claim 18 wherein said doped semiconductor body comprises a P-doped body, and said central region and said pair of adjacent regions are N+ doped regions.

21. A cell for an integrated circuit which functions as a black level calibration circuit for an image detector which provides an output signal representing a single pixel of a detected image, said integrated circuit comprising:

- a sensor cell comprising a doped semiconductor body doped with a first type of impurity, a central region formed in said body doped with an opposite type of impurity, and a pair of additional regions formed in said body doped with said opposite type of impurity, said pair of additional regions being formed in said body spaced away from said central region to form first and second MOSFET channel regions therebetween,
- a gate oxide layer formed over said substrate including said pair of regions and said central region,
- a precharge transistor for precharging said cell having a precharge control gate electrode formed above said first channel region, said first control gate electrode extending between said central region and a first one of said pair of regions,
- said sensor cell including a photodiode,
- a read transistor for reading charge from said photodiode having a sensing control gate electrode formed above said second channel region, said second control gate electrode extending between said central region and the other one of said pair of regions,
- a photodiode formed at the interface between said substrate and said central region, and
- said photodiode being shielded from being exposed for sensing incident electromagnetic radiation.

22. An integrated circuit which functions as an image detector which provides an output signal representing the detected image, said integrated circuit comprising:

- a two dimensional array of sensor cells formed in rows and columns,
- digital timing control means with outputs there from for providing timing signals,
- an address encoder, coupled to receive timing control signals from said digital timing control means,
- each said sensor cell having a photodiode and a first transistor having a first gate and having a source/drain circuit for precharging said cell and a second transistor having a second gate and a source/drain circuit for reading from said photodiode,
- said sensor cells being adapted for sensing electromagnetic radiation incident thereon,
- a plurality of sensor data amplifiers for receiving data from said cells,
- means for reading data from said cells into said sensor data amplifiers, and
- said sensor data amplifiers including an output circuit,
- said circuit including a cell for an integrated circuit comprising:
  - a sensor cell comprising a doped semiconductor body doped with a first type of impurity, a central region formed in said body doped with an opposite type of impurity, and a pair of additional regions formed in said body doped with said opposite type of impurity, said pair of additional regions being formed in said body spaced away from said central region to form first and second MOSFET channel regions therebetween,
  - a gate oxide layer formed over said substrate including said pair of regions and said central region,
  - a precharge transistor for precharging said cell having a precharge control gate electrode formed above said first channel region, said first control gate electrode extending between said central region and a first one of said pair of regions,
  - a read transistor for reading charge from said photodiode having a sensing control gate electrode formed above said second channel region, said second control gate electrode extending between said central region and the other one of said pair of regions,
  - a photodiode formed at the interface between said substrate and said central region, and
  - said photodiode being shielded from being exposed for sensing incident electromagnetic radiation.

* * * * *